United States Patent
Wark

(10) Patent No.: US 7,402,902 B2
(45) Date of Patent: Jul. 22, 2008

(54) METHODS FOR STACKING WIRE-BONDED INTEGRATED CIRCUIT DICE ON FLIP-CHIP BONDED INTEGRATED CIRCUIT DICE

(75) Inventor: James M. Wark, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/601,969

(22) Filed: Nov. 20, 2006

(65) Prior Publication Data

US 2007/0063229 A1 Mar. 22, 2007

Related U.S. Application Data

(60) Division of application No. 11/252,389, filed on Oct. 18, 2005, now Pat. No. 7,282,792, which is a division of application No. 11/086,144, filed on Mar. 22, 2005, now Pat. No. 7,109,059, which is a continuation of application No. 10/634,074, filed on Aug. 4, 2003, now Pat. No. 6,869,826, which is a continuation of application No. 10/156,976, filed on May 29, 2002, now Pat. No. 6,605,489, which is a continuation of application No. 09/642,134, filed on Aug. 18, 2000, now Pat. No. 6,399,416, which is a continuation of application No. 09/390,889, filed on Sep. 7, 1999, now Pat. No. 6,140,149, which is a continuation of application No. 08/914,719, filed on Aug. 19, 1997, now Pat. No. 6,071,754, which is a continuation of application No. 08/752,802, filed on Nov. 20, 1996, now Pat. No. 5,696,031.

(51) Int. Cl.
*H01L 23/02* (2006.01)

(52) U.S. Cl. ...................... 257/686; 257/678

(58) Field of Classification Search ................. 257/678, 257/686
See application file for complete search history.

(56) References Cited

U.S. PATENT DOCUMENTS 4,247,596 A 1/1981 Yee (Continued)

FOREIGN PATENT DOCUMENTS

JP 62-8534 1/1987

(Continued)

OTHER PUBLICATIONS

H.K. Charles, Jr., *Electronic Interconnection*, Electronic Materials Handbook™, vol. 1, Packaging, pp. 224-236 (Nov. 1989).

(Continued)

*Primary Examiner*—Douglas M Menz
(74) *Attorney, Agent, or Firm*—TraskBritt

(57) ABSTRACT

An inventive electronic device, such as a multi-chip module (MCM), a Single In-line Memory Module (SIMM), or a Dual In-line Memory Module (DIMM), includes a base, such as a printed circuit board, having a surface on which flip-chip pads and wire-bondable pads are provided. The flip-chip pads define an area on the surface of the base at least partially bounded by the wire-bondable pads. A first integrated circuit (IC) die is flip-chip bonded to the flip-chip pads, and a second IC die is back-side attached to the first IC die and then wire-bonded to the wire-bondable pads. As a result, the flip-chip mounted first IC die is stacked with the second IC die in a simple, novel manner.

12 Claims, 5 Drawing Sheets

U.S. PATENT DOCUMENTS

| | | | |
|---|---|---|---|
| 4,377,619 A | 3/1983 | Schonhorn et al. |
| 4,447,857 A | 5/1984 | Marks et al. |
| 4,567,643 A | 2/1986 | Droguet et al. |
| 4,991,000 A | 2/1991 | Bone et al. |
| 5,008,736 A | 4/1991 | Davies et al. |
| 5,012,323 A | 4/1991 | Farnworth |
| 5,128,831 A | 7/1992 | Fox, III et al. |
| 5,228,192 A | 7/1993 | Salatino |
| 5,252,857 A | 10/1993 | Kane et al. |
| 5,279,991 A | 1/1994 | Minahan et al. |
| 5,281,846 A | 1/1994 | Kaiser |
| 5,291,061 A | 3/1994 | Ball |
| 5,291,064 A | 3/1994 | Kurokawa |
| 5,311,059 A | 5/1994 | Banerji et al. |
| 5,322,207 A | 6/1994 | Fogal et al. |
| 5,323,060 A | 6/1994 | Fogal et al. |
| 5,355,283 A | 10/1994 | Marrs et al. |
| 5,387,815 A | 2/1995 | Nishiguchi |
| 5,394,303 A | 2/1995 | Yamaji |
| 5,399,898 A | 3/1995 | Rostoker |
| 5,399,903 A | 3/1995 | Rostoker et al. |
| 5,422,435 A | 6/1995 | Takiar et al. |
| 5,426,566 A | 6/1995 | Beilstein, Jr. et al. |
| 5,434,745 A | 7/1995 | Shokrgozar et al. |
| 5,436,203 A | 7/1995 | Lin |
| 5,467,253 A | 11/1995 | Heckman et al. |
| 5,468,999 A | 11/1995 | Lin et al. |
| 5,483,024 A | 1/1996 | Russell et al. |
| 5,495,398 A | 2/1996 | Takiar et al. |
| 5,502,289 A | 3/1996 | Takiar et al. |
| 5,508,561 A | 4/1996 | Tago et al. |
| 5,514,907 A | 5/1996 | Moshayedi |
| 5,527,740 A | 6/1996 | Golwalkar et al. |
| 5,600,175 A | 2/1997 | Orthmann |
| 5,696,031 A | 12/1997 | Wark |
| 5,721,452 A | 2/1998 | Fogal et al. |
| 5,804,004 A | 9/1998 | Tuckerman et al. |
| 5,851,845 A | 12/1998 | Wood et al. |
| 5,855,821 A | 1/1999 | Chau et al. |
| 5,874,781 A | 2/1999 | Fogal et al. |
| 5,886,412 A | 3/1999 | Fogal et al. |
| 5,917,242 A | 6/1999 | Ball |
| 5,923,955 A | 7/1999 | Wong |
| 5,963,794 A | 10/1999 | Fogal et al. |
| 5,973,403 A | 10/1999 | Wark |
| 6,002,177 A | 12/1999 | Gaynes |
| 6,051,886 A | 4/2000 | Fogal et al. |
| 6,071,754 A | 6/2000 | Wark |
| 6,077,725 A | 6/2000 | Degani et al. |
| 6,140,149 A | 10/2000 | Wark |
| 6,165,815 A | 12/2000 | Ball |
| 6,215,193 B1 | 4/2001 | Tao et al. |
| 6,337,227 B1 | 1/2002 | Ball |
| 6,399,416 B1 | 6/2002 | Wark |
| 6,605,489 B2 | 8/2003 | Wark |

FOREIGN PATENT DOCUMENTS

| | | |
|---|---|---|
| JP | 63-104343 | 5/1988 |
| JP | 63-179537 | 7/1988 |
| JP | 1-303730 | 12/1989 |
| JP | 5-13665 | 1/1993 |

OTHER PUBLICATIONS

IBM Technical Disclosure Bulletin, vol. 28, No. 2, Jul. 1985, pp. 811-812.
IBM Technical Disclosure Bulletin, vol. 12, No. 10, Mar. 1970, pp. 1579-1581.

METHODS FOR STACKING WIRE-BONDED INTEGRATED CIRCUIT DICE ON FLIP-CHIP BONDED INTEGRATED CIRCUIT DICE

CROSS-REFERENCE TO RELATED APPLICATIONS

This application is a divisional of application Ser. No. 11/252,389, filed Oct. 18, 2005, now U.S. Pat. No. 7,282,792, issued Oct. 16, 2007, which is a divisional of application Ser. No. 11/086,144, filed Mar. 22, 2005, now U.S. Pat. No. 7,109,059, issued Sep. 19, 2006, which is a continuation of application Ser. No. 10/634,074, filed Aug. 4, 2003, now U.S. Pat. No. 6,869,826, issued Mar. 22, 2005, which is a continuation of application Ser. No. 10/156,976, filed May 29, 2002, now U.S. Pat. No. 6,605,489, issued Aug. 12, 2003, which is a continuation of application Ser. No. 09/642,134, filed Aug. 18, 2000, now U.S. Pat. No. 6,399,416, issued Jun. 4, 2002, which is a continuation of application Ser. No. 09/390,889, filed Sep. 7, 1999, now U.S. Pat. No. 6,140,149, issued Oct. 31, 2000, which is a continuation of application Ser. No. 08/914,719, filed Aug. 19, 1997, now U.S. Pat. No. 6,071,754, issued Jun. 6, 2000, which is a continuation of application Ser. No. 08/752,802, filed Nov. 20, 1996, now U.S. Pat. No. 5,696,031, issued Dec. 9, 1997. The present application is also related to application Ser. No. 08/602,503, filed Feb. 20, 1996.

BACKGROUND OF THE INVENTION

1. Field of the Invention

The present invention relates in general to stacked integrated circuit (IC) dice, and, in particular, to devices and methods for stacking wire-bonded IC dice on flip-chip bonded IC dice.

2. State of the Art

Integrated circuit (IC) dice or "chips" are small, generally rectangular IC devices cut from a semiconductor wafer, such as a silicon wafer, on which multiple ICs have been fabricated. Traditionally, bare IC dice are packaged to protect them from corrosion by enclosing them in die packages. Such packages work well to protect IC dice, but they can be more bulky than desirable for certain multi-chip applications requiring compact die packaging.

Accordingly, a variety of compact die packaging techniques exists. In one such technique, the back-side surface of a bare IC die is directly mounted on the surface of a Printed Circuit Board (PCB), and bond pads on the front-side surface of the bare die are then wire-bonded to wire-bondable pads on the surface of the PCB to interconnect circuitry in the die with external circuitry through conductive traces on the PCB. This technique may be referred to as "Chip-On-Board (COB) with wire-bonding." In another such technique, conductive "bumps" on the front-side surface of a bare IC die are bonded to "flip-chip" pads on the surface of a PCB to interconnect circuitry in the die with external circuitry. Both the COB with wire-bonding technique and the flip-chip technique are well known to those of skill in the field of this invention, and are described in more detail in U.S. Pat. Nos. 5,422,435, 5,495,398, 5,502,289, and 5,508,561.

While these traditional compact die packaging techniques are more compact than the bulky die packages described above, they still are not compact enough for some multi-chip applications requiring many chips in a small area. For example, an ever-growing demand for Dynamic Random Access Memory (DRAM) capacity is driving a need for ever-more DRAM memory chips to be packed into a small area.

As a consequence, a variety of techniques exists for stacking chips on top of one another to increase the number of chips provided in a small area. As described in U.S. Pat. Nos. 5,228,192, 5,252,857, and 5,514,907, some of these techniques involve mounting individual bare IC dice, or individual dice packaged using a traditional die package, to parts of a structure, and then assembling the structure so the mounted dice are stacked. Also, as described in U.S. Pat. No. 5,323,060, another technique involves stacking bare IC dice on top of one another, and then wire-bonding the dice to a PCB and to one another. Similarly, as described in U.S. Pat. No. 5,399,898, a further technique involves stacking exotic IC dice having conductive bumps or pads on both sides on top of one another and then flip-chip bonding the dice to a PCB and to one another. Further, as described in U.S. Pat. Nos. 5,422,435, 5,495,398, and 5,502,289, an additional technique involves stacking bare IC dice on top of a die mounted to a PCB using the COB with the wire-bonding technique described above. These stacked dice are then wire-bonded to the PCB and to one another, or are interconnected using flip-chip bumps, or both. In addition, as described in U.S. Pat. No. 5,527,740, a still further technique involves back-side bonding a pair of IC dice to one another and then wire-bonding bond pads on the front sides of the bonded dice to a PCB.

While all of these stacking techniques work well to increase the density of chips provided in a given area, they do not provide a simple stacking technique for IC dice flip-chip mounted to a PCB in the manner described above. They also do not provide a stacking technique that can be used to repair or replace a defective IC die flip-chip mounted to a PCB. Such "repair" stacking techniques are well known for IC dice mounted to a PCB using the COB with wire-bonding technique, as described in U.S. Pat. No. 4,567,643.

Therefore, there is a need in the art for a simple stacking technique for IC dice flip-chip mounted to a PCB or any other base, and the inventive technique should be useful for repairing or replacing flip-chip mounted IC dice.

BRIEF SUMMARY OF THE INVENTION

An inventive electronic device, such as a multi-chip module (MCM), a Single In-line Memory Module (SIMM), or a Dual In-line Memory Module (DIMM), includes a base, such as a printed circuit board, having a surface on which flip-chip pads and wire-bondable pads are provided. The flip-chip pads define an area on the surface of the base at least partially bounded by the wire-bondable pads. A first integrated circuit (IC) die is flip-chip bonded to the flip-chip pads, and a second IC die of the same type as the first die is back-side attached to the first IC die and then wire-bonded to the wire-bondable pads. As a result, the flip-chip mounted first IC die is stacked with the second IC die in a simple, novel manner. Because the first and second IC dice are of the same type, the flip-chip pads and the wire-bondable pads are interconnected so they "electrically mirror" one another (i.e., so corresponding bond pads on the "flipped" first IC die and the second IC die are interconnected).

In another embodiment of the present invention, a memory device includes one or more electronic devices, as described above. In a further embodiment, an electronic system includes input, output, memory, and processor devices, and one of these devices includes a base, first IC die, and second IC die, as described above. In still further embodiments, the wire-bondable and flip-chip pads of the electronic device, described above, are interconnected in single and multiple layers of the base.

In an additional embodiment, an electronic device, as described above, also includes a third IC die back-side attached to the second IC die and then wire-bonded to the wire-bondable pads on the surface of the base. In a still additional embodiment, an electronic system includes input, output, memory, and processor devices, and one of these devices includes a base and first, second, and third IC dice, as described above.

In still another embodiment, a base has a surface on which flip-chip pads are arranged in a pattern. The flip-chip pads are flip-chip connectable to flip-chip bumps on a first IC die carryable on the surface. Wire-bondable pads are interconnected with the flip-chip pads and are arranged in a pattern on the surface so the wire-bondable pads as a group "electrically mirror" the flip-chip pads as a group. The wire-bondable pads at least partially bound an area defined by the pattern of flip-chip pads and are wire-bondable to bond pads on a second IC die carryable on the first IC die. An additional embodiment is a method of making a base, as described above.

In yet another embodiment, an electronic system includes input, output, memory, and processor devices, and one of these devices includes a base, as described above.

In an additional embodiment, a method of assembling a multi-chip structure on a base having a surface for carrying the structure includes: providing a plurality of flip-chip pads arranged in a pattern on the surface of the base defining an area thereon; providing a plurality of wire-bondable pads arranged in a pattern on the surface of the base and at least partially bounding the area defined by the pattern of flip-chip pads; interconnecting the wire-bondable pads and the flip-chip pads so the wire-bondable pads as a group electrically mirror the flip-chip pads as a group; positioning a first IC chip so a front-side surface thereof faces the surface of the base with a gap therebetween and with a plurality of flip-chip bumps on the front-side surface aligned with the flip-chip pads on the surface of the base; connecting the flip-chip bumps on the front-side surface of the first chip to the flip-chip pads on the surface of the base; sealing the gap between the front-side surface of the first chip and the surface of the base; positioning a second IC chip so a back-side surface thereof faces a back-side surface of the first chip; attaching the back-side surface of the second chip to the back-side surface of the first chip; connecting a plurality of bond pads on a front-side surface of the second chip to the wire-bondable pads on the surface of the base; and sealing the first and second chips.

In a further embodiment, a method of repairing an IC die having flip-chip bumps that are bonded to flip-chip pads on a surface of a die-carrying base, such as a printed circuit board, includes: providing wire-bondable pads on the surface of the base arranged generally about the perimeter of the flip-chip bonded die and each connected to one of a group of conductors through which the flip-chip bonded die communicates with circuitry external to the die; back-bonding a replacement IC die to the back-side surface of the flip-chip bonded IC die; disconnecting the flip-chip bonded IC die from the conductors; and wire-bonding bond pads on the replacement die to the wire-bondable pads on the surface of the base so the replacement die may communicate with circuitry external to the die.

DETAILED DESCRIPTION OF THE INVENTION

Figure 1:
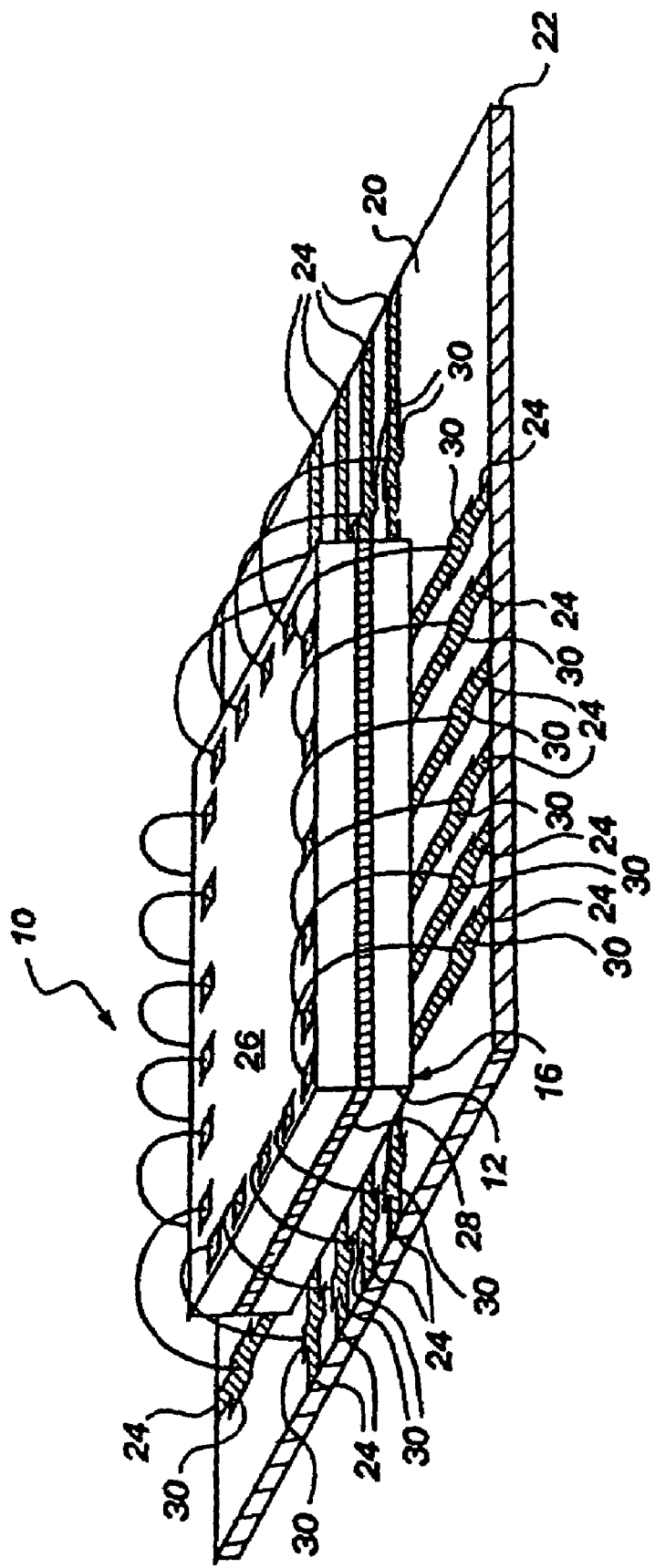
FIG. 1 is an isometric view of a portion of a multi-chip module in accordance with the present invention.

As shown in FIG. 1, an inventive Multi-Chip Module (MCM) 10 includes a flip-chip integrated circuit (IC) die 12 with flip-chip bumps (not shown) on its front-side surface 16, reflow-soldered in a well-known manner to flip-chip pads (not shown) screen printed on a surface 20 of a printed circuit board (PCB) 22. Circuitry (not shown) within the flip-chip IC die 12 communicates with external circuitry (not shown) through conductors 24 connected to the flip-chip pads (not shown). Although the present invention will be described with respect to the MCM 10, it will be understood by those having skill in the field of the invention that the invention includes within its scope a wide variety of electronic devices other than MCMs, including, for example, memory devices such as Single In-line Memory Modules (SIMMs) and Dual In-line Memory Modules (DIMMs). It will also be understood that the flip-chip IC die 12 may comprise any IC die having flip-chip bumps, and that the flip-chip IC die 12 may be bonded to the flip-chip pads (not shown) using methods other than reflow soldering. Further, it will be understood that the flip-chip pads (not shown) may be provided on the surface 20 using a method other than screen printing, such as selective plating, and that the present invention includes within its scope bases other than the PCB 22.

A wire-bondable IC die 26 is stacked on top of the flip-chip IC die 12. This may be done, for example, to increase the amount of Dynamic Random Access Memory (DRAM) provided on the PCB 22 if the IC dice 12 and 26 are DRAM IC dice. It may also be done to replace the flip-chip IC die 12 with the wire-bondable IC die 26 if the flip-chip IC die 12 is defective. Of course, it will be understood that the wire-bondable IC die 26 may be any wire-bondable IC die.

A back-side surface of the wire-bondable IC die 26 is attached to a back-side surface of the flip-chip IC die 12 with epoxy 28, and bond pads on front-side surface 16 of the wire-bondable IC die 26 are wire-bonded to wire-bondable pads 30 screen printed on the surface 20 of the PCB 22. Of course, it will be understood that the IC dice 12 and 26 may be back-bonded using means other than epoxy, and that the wire-bondable pads 30 may be provided on the surface 20 using a method other than screen printing, such as selective plating.

As will be described in more detail below with respect to FIGS. 3A and 3B, it will also be understood that, while the present invention will be described with respect to IC dice 12 and 26 that perform the same functions and thus require common connections among the flip-chip pads (not shown) and the wire-bondable pads 30, the present invention includes within its scope pads that are connected to different conductors so the IC dice 12 and 26 may receive different signals and perform different functions.

If the wire-bondable IC die 26 is being used to replace a defective flip-chip IC die 12, communication between the defective flip-chip IC die 12 and external circuitry (not shown) is interrupted by cutting the conductors 24 at locations proximate to each of the flip-chip pads (not shown). Of course, the present invention includes within its scope other methods for interrupting communication between the flip-chip IC die 12 and external circuitry, including, for example, de-selecting or de-powering the flip-chip IC die 12. With communication between the flip-chip IC die 12 and external circuitry interrupted, the wire-bondable IC die 26 communicates with external circuitry through the conductors 24 without interference from the defective flip-chip IC die 12.

Thus, the present invention provides a simple stacking technique for IC dice flip-chip mounted to a PCB or any other base, and the inventive technique is useful for repairing or replacing flip-chip mounted IC dice.

A method of assembling the MCM 10 includes: screen printing or selectively plating the flip-chip pads (not shown) and wire-bondable pads 30; picking and placing the flip-chip IC die 12; reflow soldering the flip-chip bumps (not shown) to the flip-chip pads (not shown); testing the connection between the flip-chip bumps (not shown) and the flip-chip pads and, if the connection fails the test, repairing the connection; underfilling the flip-chip IC die 12; picking and placing the wire-bondable IC die 26; back-bonding the IC dice 12 and 26 to one another with un-cured epoxy; curing the epoxy; wire-bonding the bond pads on the wire-bondable IC die 26 to the wire-bondable pads 30; testing the connection between the bond pads and the wire-bondable pads 30 and, if the connection fails the test, repairing the connection; and encapsulating the IC dice 12 and 26.

Figure 2:
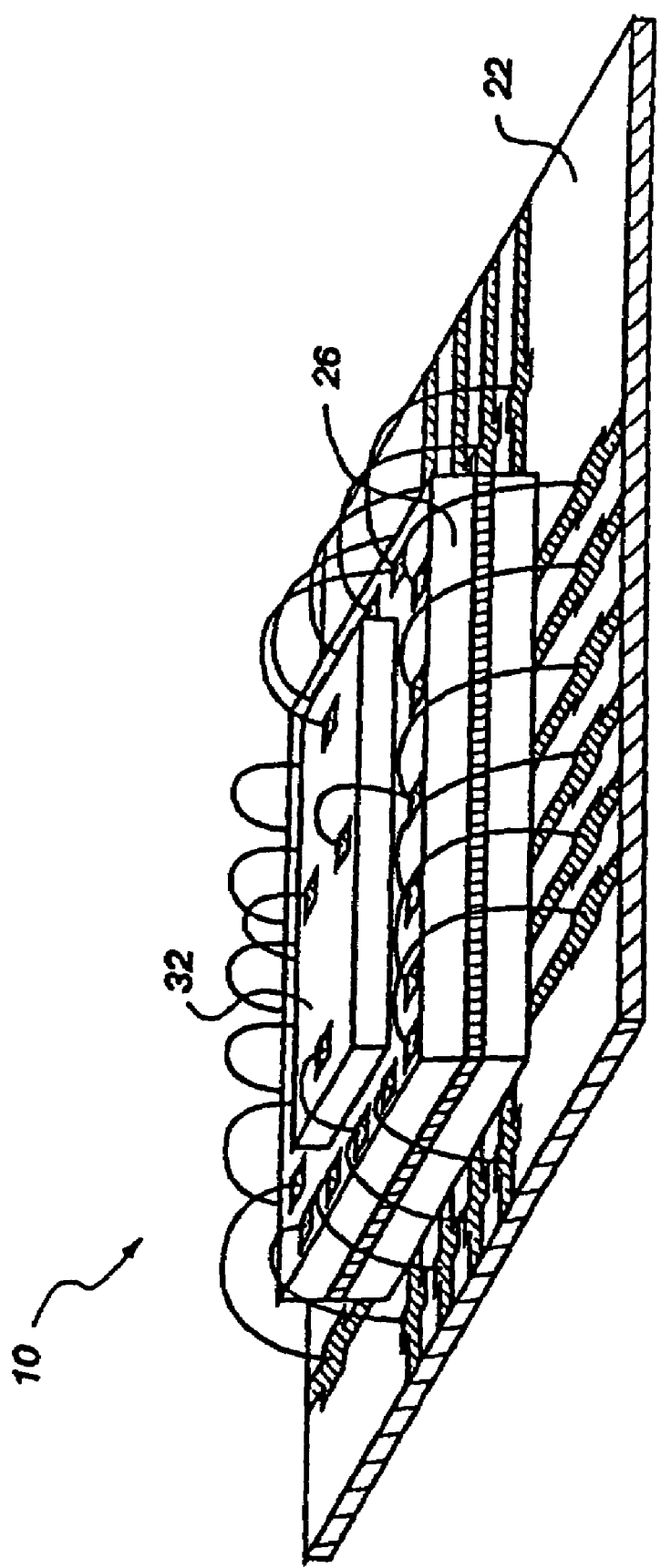
FIG. 2 is an isometric view of the multi-chip module of FIG. 1 including an additional stacked die.

As shown in FIG. 2, the MCM 10 includes an additional IC die 32 back-side attached to the wire-bondable IC die 26 and wire-bonded to the bond pads of the wire-bondable IC die 26. As a result, the density of dice on the PCB 22 is increased. Of course, although only one additional IC die 32 is shown in FIG. 2 stacked on top of the wire-bondable IC die 26, the present invention includes within its scope multiple dice stacked on top of the wire-bondable IC die 26.

Figure 3A:
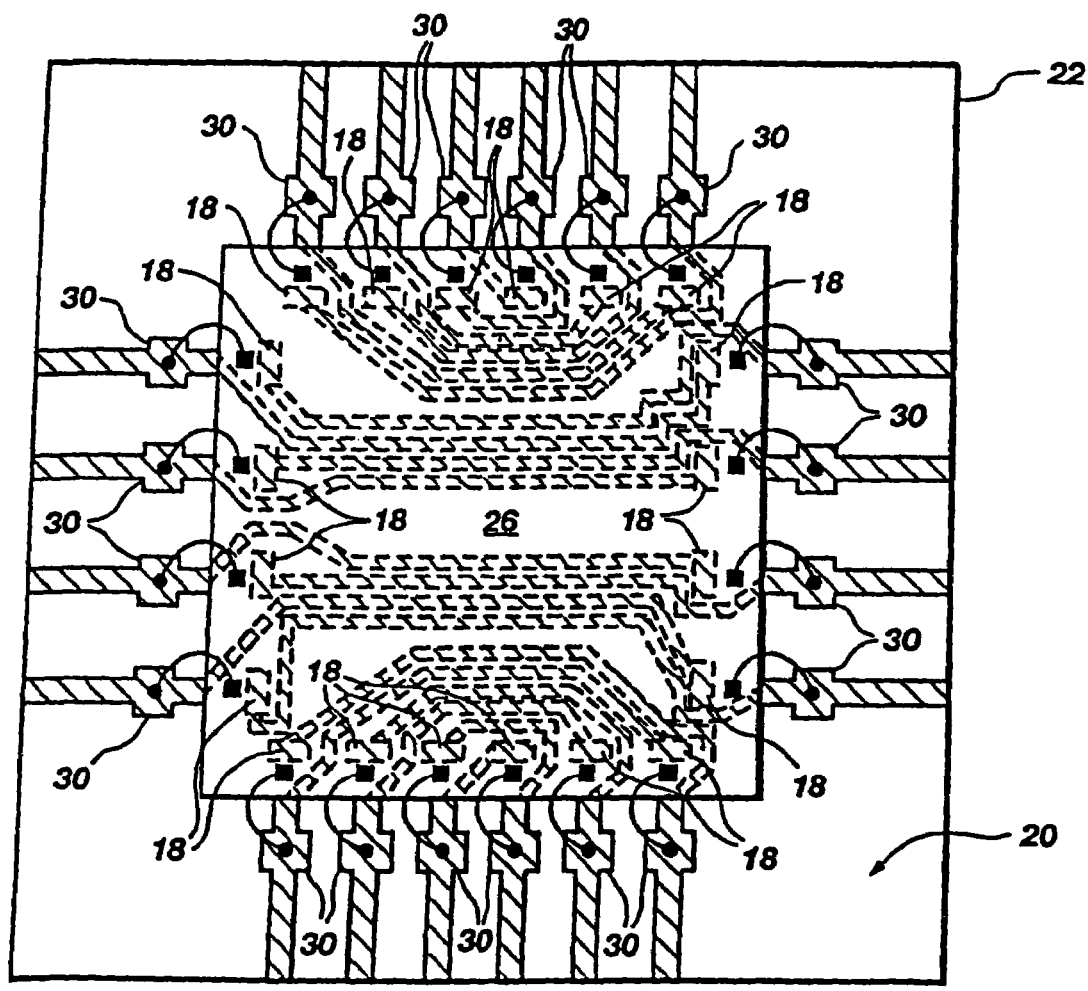
FIGS. 3A and 3B are respective top plan and isometric views of the multi-chip module of FIG. 1 showing alternative embodiments of the module in detail.

As shown in a top plan view in FIG. 3A, the flip-chip IC dice 12 (shown in FIG. 1) and 26 are identical with respect to the arrangement of their bond pads and the functions associated with their respective bond pads. As a result, the bond pads of the flip-chip IC die 12 (shown in FIG. 1) are oriented in a "flipped" relationship with respect to the bond pads of the wire-bondable IC die 26. Consequently, the flip-chip pads 18 on the PCB 22 are interconnected with the wire-bondable pads 30 on the surface 20 of the PCB 22 so bond pads on each of the flip-chip IC dice 12 (shown in FIG. 1) and 26 that are associated with the same function are interconnected, thus allowing both IC dice 12 and 26 to operate in parallel. The flip-chip pads 18 may be said to then "electrically mirror" the wire-bondable pads 30. Of course, it will be understood that a wide variety of interconnection arrangements which vary widely from that shown in FIG. 3A is within the scope of the present invention.

Figure 3B:
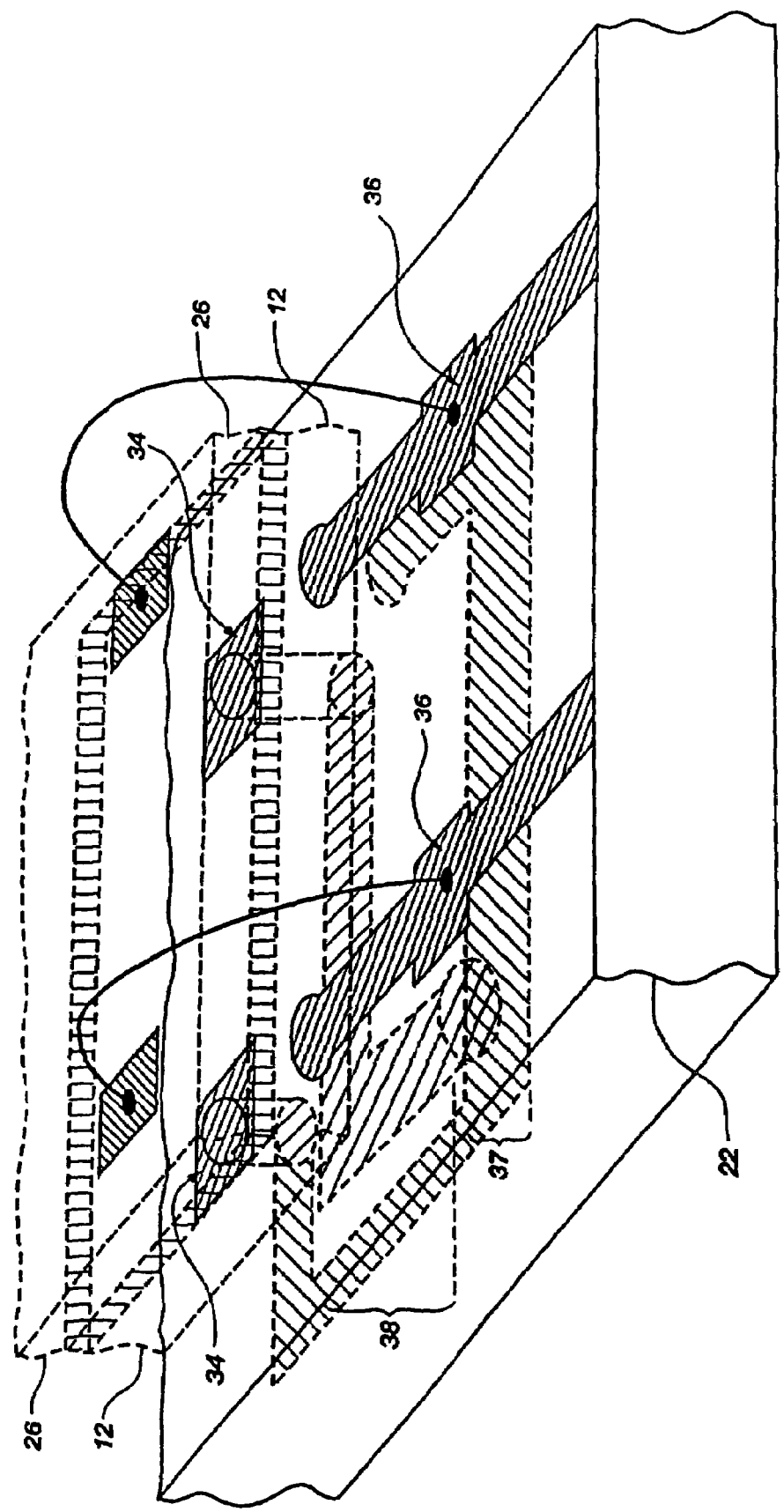

As shown in FIG. 3B in a portion of an alternative interconnection arrangement, the IC dice 12 and 26 are identical with respect to the arrangement of their bond pads and the functions associated with their respective bond pads. As a result, the bond pads of the flip-chip IC die 12 are oriented in a "flipped" relationship with respect to the bond pads of the wire-bondable IC die 26. Consequently, flip-chip pads 34 on the PCB 22 are interconnected with wire-bondable pads 36 on the PCB 22 through different layers 37 and 38 in the PCB 22 so bond pads on each of the IC dice 12 and 26 that are associated with the same function are interconnected, thus allowing both IC dice 12 and 26 to operate in parallel. The flip-chip pads 34 may be said to then "electrically mirror" the wire-bondable pads 36. Of course, it will be understood that a wide variety of multi-layer PCB interconnection arrangements which vary widely from that shown in FIG. 3B are within the scope of the present invention.

Figure 4:
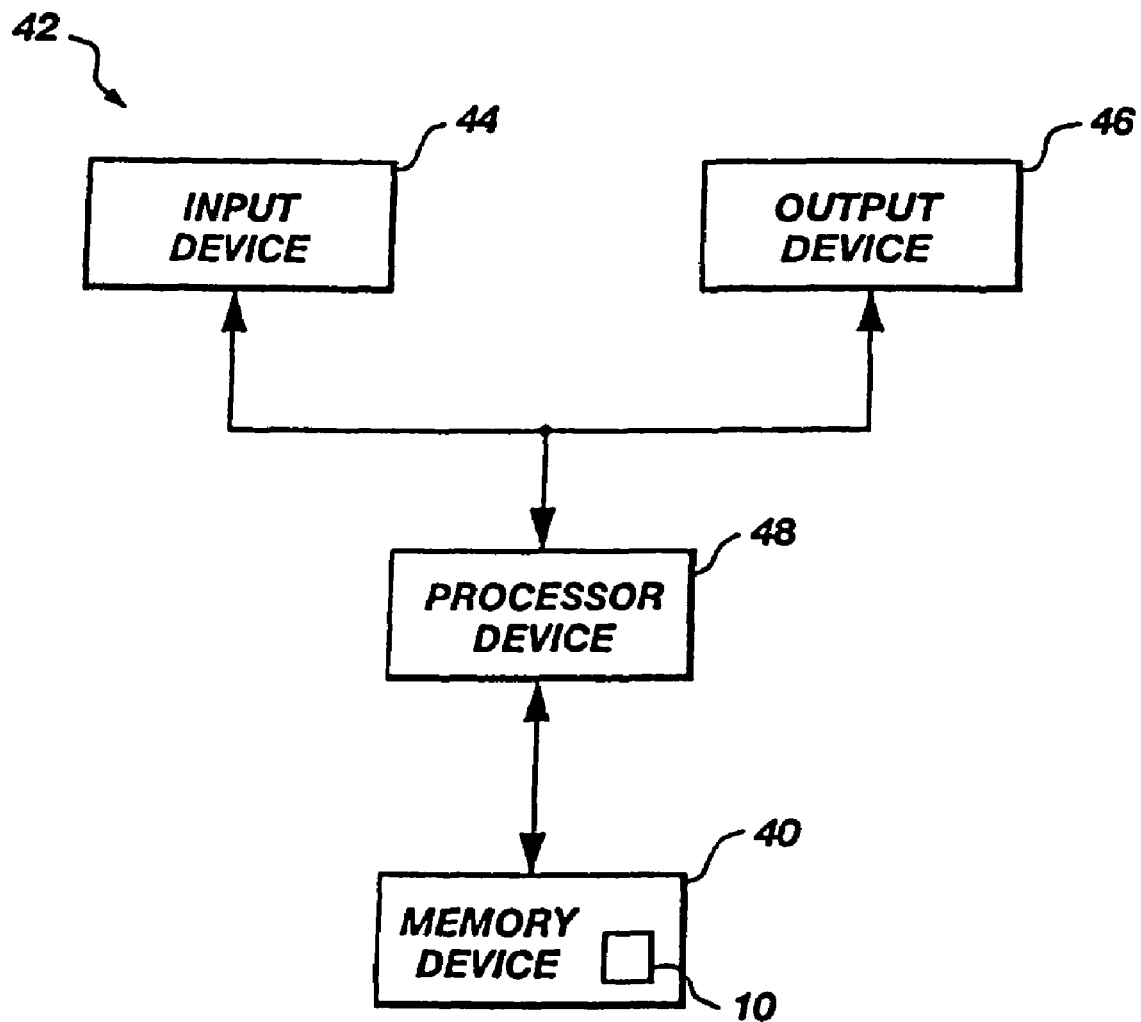
FIG. 4 is a block diagram of an electronic system including the multi-chip module of FIG. 1.

As shown in FIG. 4, the MCM 10 is incorporated into a memory device 40 in an electronic system 42 that also includes an input device 44, an output device 46, and a processor device 48. It will be understood that the MCM 10 may alternatively be incorporated into any one or all of the input, output, and processor devices 44, 46, and 48.

Although the present invention has been described with reference to particular embodiments, the invention is not limited to these described embodiments. Rather, the invention is limited only by the appended claims, which include within their scope all equivalent devices or methods which operate according to the principles of the invention as described.

What is claimed is:

1. A memory device comprising at least two electronic devices, each memory device including:
   a base having a surface having a first plurality of flip-chip pads thereon and a second plurality of wire-bondable pads, a majority of flip-chip pads of the first plurality of flip-chip pads connected to a majority of the wire bondable pads of the second plurality of wire-bondable pads;
   a first integrated circuit memory chip having opposing front-side and back-side surfaces, the front-side surface having a plurality of flip-chip bumps thereon connected to the at least one flip-chip pad of the first plurality of flip-chip pads on the surface of the base;
   a second integrated circuit memory chip having opposing front-side and back-side surfaces, the back-side surface attached to the back-side surface of the first integrated circuit memory chip and the front-side surface having a plurality of bond pads thereon; and
   at least one connection between at least one bond pad of the plurality of bond pads on the front-side surface of the second integrated circuit memory chip and the at least one wire-bondable pad of the second plurality of wire-bondable pads on the surface of the base.

2. The memory device of claim 1, wherein the first plurality of flip-chip pads and the second plurality of wire-bondable pads are interconnected in a single layer of the base.

3. The memory device of claim 1, wherein the base includes multiple layers, wherein the first plurality of flip-chip pads and the second plurality of wire-bondable pads are interconnected in a plurality of the layers of the base.

4. The memory device of claim 1, wherein the base comprises a printed circuit board.

5. The memory device of claim 1, wherein the first and second integrated circuit dice are the same type of die and the plurality of flip-chip bumps on the first integrated circuit die are arranged in a pattern identical to that of the plurality of bond pads on the second integrated circuit die.

6. An assembly forming a memory device comprising at least two electronic devices, each memory device including:
   a base having a surface having a first plurality of flip-chip pads thereon and a second plurality of wire-bondable pads, a number of the first plurality of flip-chip pads connected to a number of the second plurality of wire-bondable pads for the first plurality of flip-chip pads as a group to electrically mirror the second plurality of wire-bondable pads as a group;
   a first integrated circuit memory chip having opposing front-side and back-side surfaces, the front-side surface having a plurality of flip-chip bumps thereon connected to the at least one flip-chip pad of the first plurality of flip-chip pads on the surface of the base;
   a second integrated circuit memory chip having opposing front-side and back-side surfaces, the back-side surface attached to the back-side surface of the first integrated circuit memory chip and the front-side surface having a plurality of bond pads thereon; and at least one connection between the at least one bond pad of the plurality of bond pads on the front-side surface of the second integrated circuit memory chip and the at least one wire-bondable pad of the second plurality of wire-bondable pads on the surface of the base.

7. The electronic device of claim 6, wherein the first plurality of flip-chip pads and the second plurality of wire-bondable pads are interconnected in a single layer of the base.

8. The electronic device of claim 6, wherein the base includes multiple layers, wherein the first plurality of flip-chip pads and the second plurality of wire-bondable pads are interconnected in a plurality of the layers of the base.

9. The electronic device of claim 6, wherein the base comprises a printed circuit board.

10. The electronic device of claim 6, wherein the first and second integrated circuit dice are the same type of die and the plurality of flip-chip bumps on the first integrated circuit die are arranged in a pattern identical to that of the plurality of bond pads on the second integrated circuit die.

11. A memory device comprising one or more electronic devices each including:
   a base having a surface with a plurality of flip-chip pads thereon defining an area thereon at least partially bounded by a plurality of wire-bondable pads thereon, the plurality of flip-chip pads being interconnected with the plurality of wire-bondable pads such that the plurality of flip-chip pads as a group electrically mirror the plurality of wire-bondable pads as a group;
   a first integrated circuit memory chip having opposing front-side and back-side surfaces, the front-side surface having a plurality of flip-chip bumps thereon facing the surface of the base in alignment with and connected to the plurality of flip-chip pads on the surface of the base; and
   a second integrated circuit memory chip having opposing front-side and back-side surfaces, the back-side surface facing the back-side surface of the first integrated memory chip in attachment therewith and the front-side surface having a plurality of bond pads thereon wire-bonded to the plurality of wire-bondable pads on the surface of the base.

12. The memory device of claim 11, wherein each electronic device is selected from a group comprising a Multi-Chip Module (MCM), a Single In-line Memory Module (SIMM), and a Dual In-line Memory Module (DIMM).

* * * * *